United States Patent
Kato et al.

(10) Patent No.: US 10,403,807 B2
(45) Date of Patent: Sep. 3, 2019

(54) THERMOELECTRIC CONVERSION MATERIAL AND METHOD FOR MANUFACTURING SAME

(71) Applicant: LINTEC CORPORATION, Itabashi-ku (JP)

(72) Inventors: Kunihisa Kato, Itabashi-ku (JP); Tsuyoshi Mutou, Itabashi-ku (JP)

(73) Assignee: LINTEC CORPORATION, Itabashi-ku (JP)

( * ) Notice: Subject to any disclaimer, the term of this patent is extended or adjusted under 35 U.S.C. 154(b) by 634 days.

(21) Appl. No.: 14/396,527

(22) PCT Filed: Apr. 17, 2013

(86) PCT No.: PCT/JP2013/061416
§ 371 (c)(1),
(2) Date: Oct. 23, 2014

(87) PCT Pub. No.: WO2013/161645
PCT Pub. Date: Oct. 31, 2013

(65) Prior Publication Data
US 2015/0075578 A1    Mar. 19, 2015

(30) Foreign Application Priority Data

Apr. 27, 2012  (JP) .................................. 2012-103751

(51) Int. Cl.
*H01L 35/08* (2006.01)
*H01L 35/16* (2006.01)
(Continued)

(52) U.S. Cl.
CPC .............. *H01L 35/08* (2013.01); *H01L 35/16* (2013.01); *H01L 35/32* (2013.01); *H01L 35/34* (2013.01)

(58) Field of Classification Search
CPC ................................................ H01L 35/00–34
See application file for complete search history.

(56) References Cited

U.S. PATENT DOCUMENTS 6,207,887 B1 *  3/2001  Bass ..................... H01L 35/32
                                                                136/201
2004/0232495 A1   11/2004  Saito et al.
(Continued)

FOREIGN PATENT DOCUMENTS

CN    101740713 A    6/2010
EP    2 131 406 A1   12/2009
(Continued)

OTHER PUBLICATIONS

Takashiri, et al., "Fabrication and characterization of bismuth-telluride-based alloy thin film thermoelectric generators by flash evaporation method." Sensors and Actuators A: Physical 138.2 (2007): 329-334.*
(Continued)

*Primary Examiner* — Eli S Mekhlin
*Assistant Examiner* — William E McClain
(74) *Attorney, Agent, or Firm* — Oblon, McClelland, Maier & Neustadt, L.L.P.

(57) ABSTRACT

The present invention provides a thermoelectric conversion material having a reduced thermal conductivity and having an improved figure of merit, and a method for producing the material. The thermoelectric conversion material has, as formed on a resin substrate having recesses, a thermoelectric semiconductor layer formed of a thermoelectric semiconductor material, wherein the resin substrate comprises one formed by curing a resin layer of a curable resin composition. The production method for the thermoelectric conversion material comprises a resin substrate formation step of transcribing a protruding structure from an original plate having the protruding structure onto a resin layer of a
(Continued)

curable resin composition and curing the layer, and a film formation step of forming a thermoelectric semiconductor layer of a thermoelectric semiconductor material on the resin substrate.

3 Claims, 3 Drawing Sheets

(51) Int. Cl.
*H01L 35/32* (2006.01)
*H01L 35/34* (2006.01)

(56) References Cited

U.S. PATENT DOCUMENTS

| | | | |
|---|---|---|---|
| 2006/0101829 A1* | 5/2006 | Morand | H01L 23/38 62/3.2 |
| 2007/0117282 A1 | 5/2007 | Saito et al. | |
| 2008/0000373 A1* | 1/2008 | Petrucci-Samija | B29C 35/0888 101/401.1 |
| 2008/0212102 A1* | 9/2008 | Nuzzo | G01N 21/554 356/445 |
| 2009/0020148 A1* | 1/2009 | Boukai | H01L 35/26 136/201 |
| 2010/0116309 A1 | 5/2010 | Park et al. | |
| 2010/0308008 A1* | 12/2010 | Zhu | B82Y 10/00 216/11 |
| 2011/0154558 A1 | 6/2011 | Peter et al. | |
| 2011/0254205 A1* | 10/2011 | Inamiya | B82Y 10/00 264/446 |
| 2012/0097204 A1* | 4/2012 | Yu | B82Y 30/00 136/200 |
| 2012/0282435 A1* | 11/2012 | Yang | B82Y 30/00 428/131 |
| 2013/0255738 A1* | 10/2013 | Mitrovic | H01L 35/26 136/200 |
| 2014/0024202 A1* | 1/2014 | Lagally | H01L 29/0665 438/478 |
| 2014/0373888 A1* | 12/2014 | Boukai | H01L 35/34 136/200 |

FOREIGN PATENT DOCUMENTS

| | | | |
|---|---|---|---|
| JP | 2958451 | 10/1999 | |
| JP | 2004 241397 | 8/2004 | |
| JP | 2007 59773 | 3/2007 | |
| TW | 201003311 A1 | 1/2010 | |
| WO | WO 99/65086 A1 | 12/1999 | |
| WO | WO 2005109535 A2 * | 11/2005 | ............ H01L 35/34 |

OTHER PUBLICATIONS

Hatab, et al. "Surface-enhanced Raman spectroscopy substrates created via electron beam lithography and nanotransfer printing." ACS nano 2.2 (2008): 377-385.*
Rizzo, et al. "Hybrid Light-Emitting Diodes from Microcontact-Printing Double-Transfer of Colloidal Semiconductor CdSe/ZnS Quantum Dots onto Organic Layers." Advanced Materials 20.10 (2008): 1886-1891.*
Yu, et al. "Reduction of thermal conductivity in phononic nanomesh structures." Nature nanotechnology 5.10 (2010): 718-721.*
Materials Safety Data Sheet for Microposit S1813 Photoresist, Shipley Company, Marlborough, MA, 1998.*
Yu, et al. "Reduction of thermal conductivity in phononic nanomesh structures." Nature nanotechnology 5.10 (2010): 718.*
Kang, et al. "Transparent Cu nanowire mesh electrode on flexible substrates fabricated by transfer printing and its application in organic solar cells." Solar Energy Materials and Solar Cells 94.6 (2010): 1179-1184.*
Carlson, et al. "Transfer printing techniques for materials assembly and micro/nanodevice fabrication." Advanced Materi.*
Extended European Search Report dated Oct. 15, 2015 in Patent Application No. 13782240.9.
Combined Office Action and Search Report dated Aug. 25, 2016 in Taiwanese Patent Application No. 102114750 (with English translation of Categories of Cited Documents).
International Search Report dated Jul. 16, 2013 in PCT/JP13/061416 Filed Apr. 17, 2013.
U.S. Appl. No. 14/428,141, filed Mar. 13, 2015, Kato, et al.
Combined Chinese Office Action and Search Report dated May 19, 2016 in Patent Application No. 201380022128.1 (with English language translation of categories of cited documents).
Office Action dated Dec. 29, 2016 in Chinese Patent Application No. 201380022128.1.
Makoto Kashiwagi, et al., "Enhanced figure of merit of a porous thin film of bismuth antimony telluride", Applied Physics Letters, vol. 98, 2011, 4 Pages.

* cited by examiner

[Fig.1]
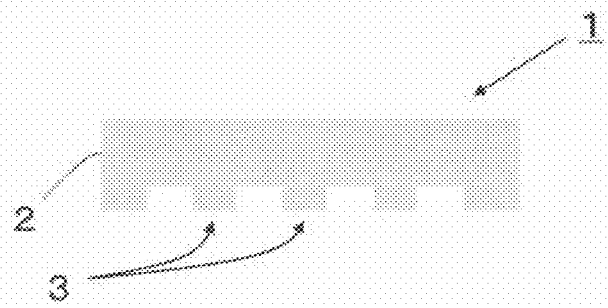
[Fig.2]
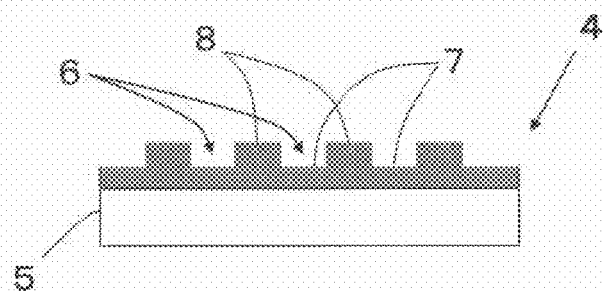
[Fig.3]
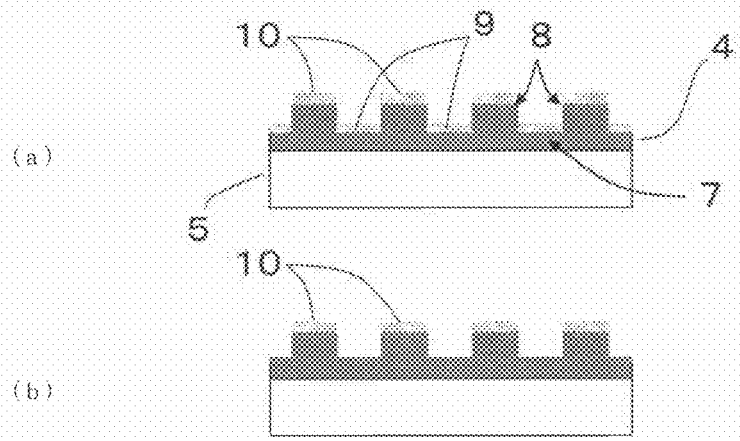

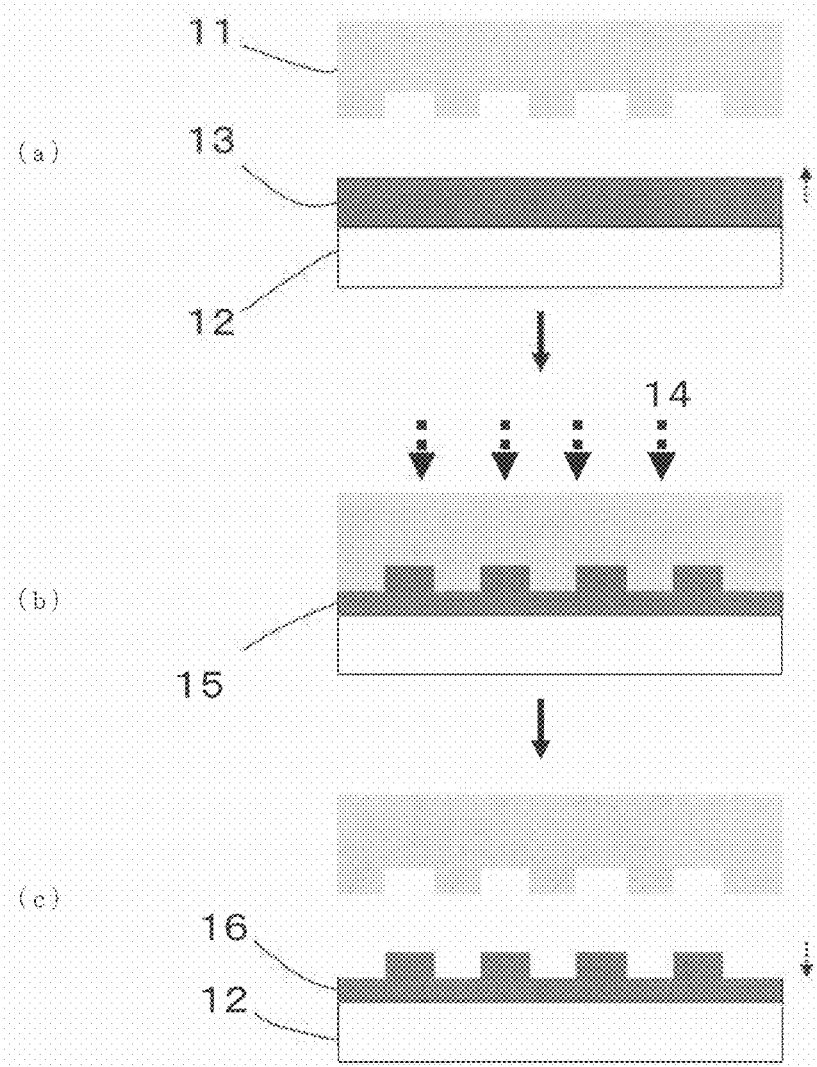

[Fig.5]
(a)
(b)
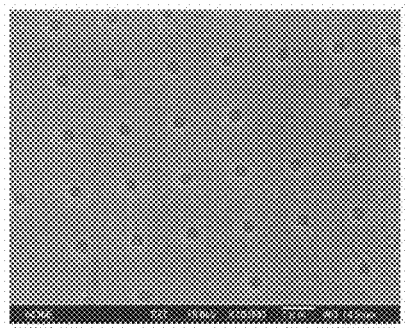
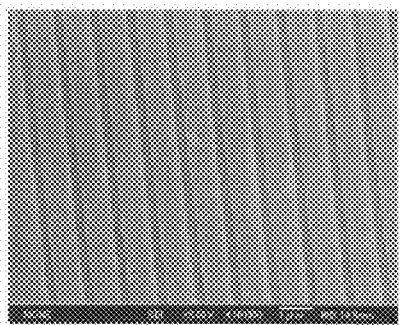
[Fig.6]
(a)
(b)
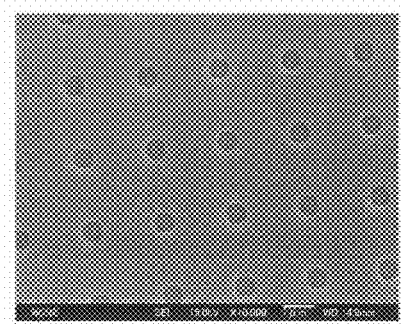
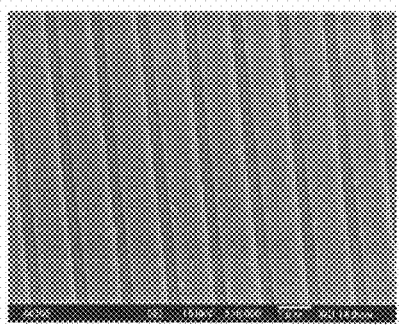

THERMOELECTRIC CONVERSION MATERIAL AND METHOD FOR MANUFACTURING SAME

This application is a National Stage of PCT/JP2013/061416, which was filed on Apr. 17, 2013. This application is based upon and claims the benefit of priority to Japanese Application No. 2012-103751, which was filed on Apr. 27, 2012.

TECHNICAL FIELD

The present invention relates to a thermoelectric conversion material that carries out energy interconversion between heat and electricity, and especially relates to a thermoelectric conversion material using a resin substrate and having a high figure of merit, and to its production method.

BACKGROUND ART

Recently, a thermoelectric power-generating technology for which the system is simple and can be down-sized has been specifically noted as a power recovery technology for unharnessed exhaust heat energy that is generated from fossil fuel resources and others used in buildings, factories, etc. However, thermoelectric power generation is, in general, poorly efficient in power generation, and therefore, studies and developments are being actively made for improving power generation efficiency in various companies and research institutes. For improving power generation efficiency, it is indispensable to enhance the efficiency of thermoelectric conversion materials, and for realizing it, it is desired to develop materials having a high electrical conductivity comparable to that of metals and having a low thermal conductivity comparable to that of glass.

A thermoelectric conversion characteristic can be evaluated by a figure of merit Z ($Z=\sigma S^2/\lambda$). Here, S means a Seebeck coefficient, $\sigma$ means an electrical conductivity (reciprocal of resistivity), and $\lambda$ means a thermal conductivity. Increasing the value of the figure of merit Z improves the power generation efficiency, and for enhancing the efficiency in power generation, it is important to find out a thermoelectric conversion material having a large Seebeck coefficient and a large electrical conductivity $\sigma$, and having a small thermal conductivity $\lambda$.

In general, the thermal conductivity $\lambda$ and the electrical conductivity $\sigma$ of a solid substance can be designed using the density of the material and the carrier concentration as parameters; however, the two physical properties are not independent of each other owing to the Wiedemann-Franz law but coordinate closely with each other, and therefore, in fact, it has heretofore been impossible to significantly improve the figure of merit. Given the situation, Patent Literature 1 proposes a thermoelectric conversion material that has been prepared by introducing a large number of supermicropores into the inside of a semiconductor material as dispersed therein at intervals equal to or smaller than the mean free path of electrons and phonons, so as to make the material porous to thereby reduce the thermal conductivity and increase the Seebeck coefficient thereof. According to Examples in Patent Literature 1, the thermal conductivity reduced but the electrical conductivity also reduced (the resistivity greatly increased), and the non-dimensional figure of merit ZT (as calculated at T, absolute temperature, 300 K) increased from 0.017 to 0.156 through porous structure formation, but the situation is that the absolute value is remote from the index value for practical use, $ZT \geq 1$.

Patent Literature 2 discloses that, when a thermoelectric conversion material is formed into thin lines according to a nanoimprinting method, then the figure of merit thereof can be improved, in which, however, the reduction in the thermal conductivity of the material is small, and the material could not still provide sufficient performance.

CITATION LIST

Patent Literature

Patent Literature 1: Japanese Patent 2958451
Patent Literature 2: JP-A 2007-59773

SUMMARY OF INVENTION

Technical Problem

In consideration of the above-mentioned situation, an object of the present invention is to provide a thermoelectric conversion material having a reduced thermal conductivity and having an improved figure of merit and to provide a method for producing the material.

Solution to Problem

The present inventors have assiduously made repeated studies for solving the above-mentioned problems and, as a result, have found, in a thermoelectric conversion material having a thermoelectric semiconductor layer of a thermoelectric semiconductor material formed on a resin substrate having recesses, when one produced by curing a resin layer of a curable resin composition, for example, an energy ray-curable resin composition is used as the resin substrate, then the figure of merit can be improved, and have completed the present invention.

Specifically, the present invention provides the following (1) to (15):

(1) A thermoelectric conversion material having, as formed on a resin substrate having recesses, a thermoelectric semiconductor layer formed of a thermoelectric semiconductor material, wherein the resin substrate comprises one formed by curing a resin layer comprising a curable resin composition.

(2) The thermoelectric conversion material according to claim (1), wherein the curable resin composition is an energy ray-curable resin composition.

(3) The thermoelectric conversion material according to the above (2), wherein the resin substrate is one formed by pressurizing an original plate having protrusions and a resin layer of the energy ray-curable resin composition arranged to face each other, irradiating them with an energy ray to cure the layer.

(4) The thermoelectric conversion material according to the above (2) or (3), wherein the energy ray-curable resin composition contains a (meth)acrylate copolymer having an energy ray-curable group in the side chain thereof.

(5) The thermoelectric conversion material according to the above (2) or (3), wherein the energy ray-curable resin composition contains a polymer not having energy ray-curability and an energy ray-curable monomer and/or oligomer.

(6) The thermoelectric conversion material according to any of the above (1) to (5), wherein the thickness of the resin substrate is from 1 to 100 μm.

(7) The thermoelectric conversion material according to any of the above (1) to (6), wherein the resin substrate has a large number of independent recesses.
(8) The thermoelectric conversion material according to any of the above (1) to (7), wherein the shape of the recesses is a columnar or grooved one.
(9) The thermoelectric conversion material according to the above (8), wherein the depth of the recesses is from 5 to 10000 nm, the diameter or the groove width of the recesses is from 10 to 5000 nm, and the distance between the centers of the neighboring recesses is from 15 to 5500 nm.
(10) The thermoelectric conversion material according to any of the above (1) to (9), wherein the thermoelectric semiconductor layer exists on the top of the resin substrate, and the inner bottom of each recess is kept electrically insulated from that top.
(11) The thermoelectric conversion material according to any of the above (1) to (10), wherein the film thickness of the thermoelectric semiconductor layer is from 10 to 5000 nm.
(12) The thermoelectric conversion material according to any of the above (1) to (11), wherein the thermoelectric semiconductor material is a bismuth-tellurium-based thermoelectric semiconductor material or a bismuth-selenide-based thermoelectric semiconductor material.
(13) A method for producing a thermoelectric conversion material having a film of a thermoelectric semiconductor layer formed on a resin substrate having recesses, which comprises a resin substrate formation step of transcribing a protruding structure from an original plate having the protruding structure onto a resin layer of a curable resin composition and curing the layer, and a film formation step of forming a thermoelectric semiconductor layer of a thermoelectric semiconductor material on the resin substrate.
(14) The method for producing a thermoelectric conversion material according to the above (13), wherein the resin substrate formation step includes a resin layer formation step of forming a resin layer from the curable resin composition, a transcription step of pressurizing the resin layer and the original plate arranged to face each other so as to transcribe the protruding structure from the original plate to the resin layer, and a recesses formation step of curing the resin layer and then peeling the layer from the original plate to form the recesses on the layer.
(15) The method for producing a thermoelectric conversion material according to the above (13), wherein the film formation step is according to a flash vapor deposition method.

Advantageous Effects of Invention

According to the present invention, there is obtained a thermoelectric conversion material having a low thermal conductivity and having an improved thermoelectric performance index, and the thermoelectric conversion material can realize a high conversion efficiency.

BRIEF DESCRIPTION OF DRAWINGS

FIG. 1 is a cross-sectional view showing one example of the original plate (nanoimprint mold) for use in the present invention.
FIG. 2 is a cross-sectional view showing one example of the resin substrate for use in the present invention.

FIG. 3 shows one example of a cross section after formation of a film of a thermoelectric semiconductor layer of a thermoelectric semiconductor material on a resin substrate for use in the present invention, in which (a) indicates a case where the thermoelectric semiconductor layer exists on the top of the resin substrate and on the inner bottom of each recess, and (b) indicates a case where the thermoelectric semiconductor layer exists only on the top of the resin substrate.
FIG. 4 includes explanatory views showing in sequence one example of the substrate formation step according to the production method of the present invention, in which the upper side of (a) is a cross-sectional view of an original plate and the underside thereof is a cross-sectional view after formation of a resin layer of an energy ray-curable resin composition on a support, (b) is a cross-sectional view showing a step of curing with an energy ray after pressurization and transcription, and (c) is a cross-sectional view of a resin substrate obtained by demolding after curing.
FIG. 5 includes planes of thermoelectric conversion materials obtained in Example 1 and Example 2 of the present invention, in which (a) is a SEM photograph (measurement magnification, 10000 times) of the thermoelectric conversion material of Example 1, and (b) is a SEM photograph (measurement magnification, 10000 times) of the thermoelectric conversion material of Example 2.
FIG. 6 includes planes of a thermoelectric conversion material obtained in Example 3 of the present invention, in which (a) is a SEM photograph (measurement magnification, 10000 times) of a part of the thermoelectric conversion material having a columnar pattern as one of a pattern mix, and (b) is a SEM photograph (measurement magnification, 10000 times) of a part of the thermoelectric conversion material having a grooved pattern of a pattern mix.

DESCRIPTION OF EMBODIMENTS

[Thermoelectric Conversion Material]
The thermoelectric conversion material of the present invention is a thermoelectric conversion material having, as formed on a resin substrate having recesses, a thermoelectric semiconductor layer formed of a thermoelectric semiconductor material, wherein the resin substrate comprises one formed by curing a resin layer comprising a curable resin composition.
(Original Plate)
A case of using a nanoimprint mold as the original plate having a protruding structure in the present invention is described below.
FIG. 1 is a cross-sectional view showing one example of the original plate (nanoimprint mold) for use in the production method of the present invention to be described below. The original plate 1 has a predetermined protruding structure 3 formed on the substrate 2. The protruding structure 3 is generally so formed as to have a shape for which the nanostructure to be formed after transcription is taken into consideration, though varying depending on the intended use thereof. The substrate 2 is not specifically defined, for which, however, generally used is quartz (transparent on the wavelength side longer than 193 nm) from the viewpoint of working accuracy, durability, etc.
The nanoimprint mold used as the original plate 1 may be formed through lithography or the like, for which, however, the production method is not specifically defined and any known method may be used. For example, a positive resist is applied to the entire surface of the substrate 2 to be the mold material, then the positive resist is processed through electron ray lithography, for UV exposure, or the like to thereby form a predetermined resist pattern, and via the formed resist pattern serving as an etching mask, the substrate 2 is etched in wet or in dry, and finally the resist residue is removed to form the protruding structure 3, thereby producing the nanoimprint mold.

The nanoimprint mold may be a commercial product. Commercial products sold by, NTT-AT and others are usable here.

Not specifically defined, the protruding structure 3 of the original plate 1 may have various shapes. For example, there are mentioned the following shapes, and these may be used suitably in accordance with the intended use thereof.
(A) Dot shape (dot shape of which the form of the protrusion is circular, oval, polygonal or the like).
(B) Line shape (line shape of which the form of the protrusion is linear, curved or the like).
(C) Pattern mix shape (where dot shape and line shape are mixed).

The pattern of the original plate 1 for use in the present invention may be any one in which the protrusions are independent of each other, including not only a linear pattern but also a curved pattern. Regarding the alignment mode thereof, the pattern may have or may not have continuity or regularity.
(Resin Substrate)

The resin substrate for use in the present invention is described.

FIG. 2 is a cross-sectional view showing one example of the resin substrate for use in the present invention. The resin substrate 4 having recesses 6 is formed on a support 5. The resin substrate 4 is produced, for example, by using the above-mentioned original plate 1 having the protruding structure 3, transcribing the structure onto a resin layer of a curable resin composition, then curing and releasing it. In this case, the recesses 6 are transcribed and formed as the reverse pattern of the protruding structure 3 of the original plate 1.

The curable resin composition may be any one satisfying insulation and curability, and for example, includes one comprising, as the main ingredient thereof, an energy ray-curable resin or a thermosetting resin. Above all, as the curable resin composition for use herein, preferred is an energy ray-curable resin composition that comprises, as the main ingredient thereof, an energy ray-curable resin, from the viewpoint that the composition has high heat resistance, does not deform by heat and can keep low thermal conductivity. Forming the recesses 6 of a curable resin composition on the resin substrate lowers the thermal conductivity of the resin substrate 4 and can improve the figure of merit of the thermoelectric conversion material.

The energy ray-curable resin composition is not specifically defined, including, for example, 1) one containing a (meth)acrylate copolymer having an energy ray-curable group in the side chain thereof, 2) one containing a polymer not having energy ray curability and an energy ray-curable monomer and/or oligomer, and 3) one containing an energy ray-curable monomer and/or oligomer as the main ingredient thereof. Of those, preferred is 1) one containing a (meth)acrylate copolymer having an energy ray-curable group in the side chain thereof or 2) one containing a polymer not having energy ray curability and an energy ray-curable monomer and/or oligomer. Using the resin composition that contains such a copolymer makes it possible to form a relatively thick resin layer, therefore providing a resin substrate having excellent heat resistance, and for example, even when a thermoelectric conversion material that uses the obtained resin substrate is driven for a long period of time, the resin substrate is hardly deformed by heat and the thermoelectric performance of the material can be prevented from lowering.

First described is a case where the energy ray-curable resin composition contains 1) a (meth)acrylate copolymer having an energy ray-curable group in the side chain thereof (hereinafter this may be referred to as "energy ray-curable copolymer"). Here, "(meth)acrylic acid" in this specification means both acrylic acid and methacrylic acid.

The (meth)acrylate copolymer having an energy ray-curable group in the side chain thereof may be prepared by reacting a (meth)acrylic copolymer having a functional group-containing monomer unit (m1) and an unsaturated group-containing compound having a substituent capable of reacting with the functional group to form a covalent bond (m2). Using the resin composition containing such a copolymer makes it possible to form an adhesive resin substrate, and therefore, the resin substrate may be stuck directly, not via any adhesive layer, to various devices such as photoelectric conversion devices, etc., or to walls, buildings, etc.

The (meth)acrylic copolymer (m1) comprises a constitutive unit derived from a functional group-containing monomer and a constitutive unit derived from a (meth)acrylate monomer or a derivative thereof. The functional group-containing monomer that the (meth)acrylic copolymer (m1) has is, for example, a monomer having a polymerizing double bond and a functional group such as a hydroxyl group, a carboxyl group, an amino group, a substituted amino group, an epoxy group or the like in the molecule, and preferably used here is a hydroxyl group-containing unsaturated compound or a carboxyl group-containing unsaturated compound.

For example, the hydroxyl group-containing unsaturated compound includes a hydroxyl group-containing (meth)acrylate such as 2-hydroxyethyl acrylate, 2-hydroxyethyl methacrylate, 2-hydroxypropyl acrylate, 2-hydroxybutyl acrylate, 2-hydroxybutyl methacrylate, etc. The carboxyl group-containing unsaturated compound includes an ethylenic unsaturated carboxylic acid such as acrylic acid, methacrylic acid, itaconic acid, etc. One alone or two or more of these may be used here either singly or as combined.

As the (meth)acrylate monomer to constitute the (meth)acrylic copolymer (m1), usable here are a benzylalkyl (meth)acrylate, a cycloalkyl (meth)acrylate, an alkyl (meth)acrylate in which the alkyl group has from 1 to 18 carbon atoms, etc. Of those, preferred is an alkyl (meth)acrylate in which the alkyl group has from 1 to 18 carbon atoms. The alkyl (meth)acrylate in which the alkyl group has from 1 to 18 carbon atoms concretely includes methyl (meth)acrylate, ethyl (meth)acrylate, propyl (meth)acrylate, n-butyl (meth)acrylate, isobutyl (meth)acrylate, t-butyl (meth)acrylate, pentyl (meth)acrylate, hexyl (meth)acrylate, cyclohexyl (meth)acrylate, 2-ethylhexyl (meth)acrylate, isooctyl (meth)acrylate, decyl (meth)acrylate, dodecyl (meth)acrylate, myristyl (meth)acrylate, palmityl (meth)acrylate, stearyl (meth)acrylate, etc. Of those, more preferred is an alkyl (meth)acrylate in which the alkyl group has from 1 to 6 carbon atoms, such as methyl (meth)acrylate, ethyl (meth)acrylate, propyl (meth)acrylate, n-butyl (meth)acrylate, etc. One alone or two or more of these may be used here either singly or as combined.

The (meth)acrylic copolymer (m1) may be prepared through copolymerization according to a known method of copolymerizing the above-mentioned functional group-containing monomer and a (meth)acrylate monomer or a derivative thereof. In addition to the monomers, the copolymer may be copolymerized with any other monomer in a small ratio (for example, 10% by mass or less, preferably 5% by mass or less).

The other monomer includes vinyl esters such as vinyl acetate, vinyl propionate, etc.; olefins such as ethylene, propylene, isobutylene, etc.; olefin halides such as vinyl chloride, vinylidene chloride, etc.; styrenic monomers such as styrene, α-methylstyrene, etc.; dienic monomers such as butadiene, isoprene, chloroprene, etc.; nitrile monomers such as acrylonitrile, methacrylonitrile, etc.; acrylamides such as acrylamide, N-methylacrylamide, N,N-dimethylacrylamide, etc. One alone or two or more of these may be used here either singly or as combined.

The (meth)acrylic copolymer (m1) contains a constitutive unit derived from the above-mentioned functional group-containing monomer generally in a ratio of from 3 to 100% by mass, preferably from 5 to 40% by mass, more preferably from 10 to 30% by mass, and a constitutive unit derived from a (meth)acrylate monomer or a derivative thereof generally in a ratio of from 0 to 97% by mass, preferably from 60 to 95% by mass, more preferably from 70 to 90% by mass.

The unsaturated group-containing compound (m2) must be suitably selected depending on the type of the functional group of the functional group-containing monomer that the (meth)acrylic copolymer (m1) has. According, for example, when the functional group of the functional group-containing monomer that the (meth)acrylic copolymer (m1) has is a hydroxyl group, an amino group or a substituted amino group, then the substituent that the unsaturated group-containing compound (m2) has is preferably an isocyanate group, an epoxy group or the like, when the functional group is a carboxyl group, then the substituent is preferably an isocyanate group, an aziridinyl group, an epoxy group or an oxazoline group, and when the functional group is an epoxy group, then the functional group is preferably an amino group, a carboxyl group or an aziridinyl group. Each one of such substituents is contained in every molecule of the unsaturated group-containing compound (m2).

From the above, as the unsaturated group-containing compound (m2), for example, there are mentioned methacryloyloxyethyl isocyanate, methacryloyl isocyanate, meta-isopropenyl-α,α-dimethylbenzyl isocyanate, allyl isocyanate; acryloyl monoisocyanate compounds produced by reacting a diisocyanate compound or a polyisocyanate compound and hydroxyethyl (meth)acrylate; acryloyl monoisocyanate compounds produced by reacting a diisocyanate compound or a polyisocyanate compound, a polyol compound and hydroxyethyl (meth)acrylate; glycidyl (meth)acrylate; (meth)acrylic acid, 2-(1-aziridinyl)ethyl (meth)acrylate, 2-vinyl-2-oxazoline, 2-isopropenyl-2-oxazoline, etc.

The unsaturated group-containing compound (m2) contains from 1 to 5, preferably from 1 or 2 energy ray-polymerizing carbon-carbon double bonds in every molecule.

The unsaturated group-containing compound (m2) is used here in a ratio of generally from 20 to 200 equivalents relative to 100 equivalents of the functional group-containing monomer in the (meth)acrylic copolymer (m1), preferably from 40 to 95 equivalents, more preferably from 60 to 90 equivalents.

For the reaction between the (meth)acrylic copolymer (m1) and the unsaturated group-containing compound (m2), the reaction temperature, the time, the solvent, the catalyst and others may be suitably selected in accordance with the combination of the functional group and the substituent of the two.

From the above, the functional group existing in the side chain in the (meth)acrylic copolymer (m1) reacts with the substituent in the unsaturated group-containing compound (m2), and the unsaturated group is thereby introduced into the side chain in the (meth)acrylic copolymer (m1) to give a (meth)acrylate copolymer having an energy ray-curable group in the side chain thereof.

The weight-average molecular weight (Mw) of the (meth)acrylate copolymer having an energy ray-curable group in the side chain thereof is preferably 100,000 or more, more preferably from 200,000 to 2,500,000, and from the viewpoint of the heat resistance thereof, even more preferably from 500,000 to 1,500,000. The weight-average molecular weight in this specification is one measured through gel permeation chromatography (GPC) using the molecular weight of standard polystyrene.

Preferably, the curable resin composition further contains a photopolymerization initiator in addition to the above-mentioned energy ray-curable copolymer. Containing a photopolymerization initiator is preferred as capable of shortening and recuing the polymerization curing time and the photoirradiation amount in photocuring the resin layer formed of an energy ray-curable resin composition. Not specifically defined, the photopolymerization initiator includes, for example, 1-hydroxy-cyclohexyl-phenylketone, 2-hydroxy-2-methyl-1-phenyl-propan-1-one, 2-methyl-1-(4-methylthiophenyl)-2-morpholinopropan-1-one, 2-benzyl-2-dimethylamino-1-(4-morpholinophenyl)-1-butanone, bis(2,4,6-trimethylbenzoyl)-phenylphosphine oxide, 4-phenylbenzophenone, 4-phenoxybenzophenone, 4,4'-diphenylbenzophenone, 4,4'-diphenoxybenzophenone, benzophenone, acetophenone, benzoin, benzoin methyl ether, benzoin ethyl ether, benzoin isopropyl ether, benzoin isobutyl ether, benzoinbenzoic acid, methyl benzoinbenzoate, benzoindimethyl ketal, 2,4-diethylthioxanthone, benzyldiphenyl sulfide, tetramethylthiuram monosulfide, azobisisobutyronitrile, benzil, dibenzyl, diacetyl, β-chloroanthraquinone, (2,4,6-trimethylbenzyldiphenyl)phosphine oxide, 2-benzothiazole-N,N-diethyldithiocarbamate, oligo{2-hydroxy-2-methyl-1-[4-(1-propenyl)phenyl]propanone}, 2,2-dimethoxy-1,2-diphenylethan-1-one, etc. Of those, preferably used is 1-hydroxy-cyclohexyl-phenyl ketone from the viewpoint that the reactivity thereof with the energy ray to be used is high, the reaction speed thereof is most suitable and the reaction may reach the depth of the resin layer. One alone or two or more of these may be used here either singly or as combined. Preferably, the photopolymerization initiator is used in an amount of from 0.1 to 10 parts by mass relative to 100 parts by mass of the energy ray-curable copolymer, more preferably from 0.5 to 5 parts by mass.

The curable resin composition may contain any other component in addition to the energy ray-curable copolymer and the photopolymerization initiator mentioned above. The other component includes, for example, a thermoplastic resin component, an energy ray-curable monomer and/or oligomer component to be mentioned below, a crosslinking agent and other additives.

The thermoplastic resin component includes, for example, polyacrylate, polyester, polyurethane, polycarbonate, polyolefin, etc.

As the crosslinking agent, usable here is a polyfunctional compound reactive with the functional group that the energy ray-curable copolymer has. Examples of the polyfunctional compound include an isocyanate compound, an epoxy compound, an amine compound, a melamine compound, an aziridine compound, a hydrazine compound, an aldehyde compound, an oxazoline compound, a metal alkoxide compound, a metal chelate compound, a metal salt, an ammonium salt, a reactive phenol resin, etc.

The other additives include, for example, a UV absorbent, a plasticizer, a filler, an antioxidant, a tackifier, a pigment, a dye, a coupling agent, organic fine particles, etc.

Incorporating the other components into the energy ray-curable resin composition improves the easiness in protruding structure transcription before curing and improves the strength after curing.

The blend amount of the other components mentioned above is preferably from 0 to 50 parts by mass as the total of the other components, relative to 100 parts by mass of the energy ray-curable copolymer, more preferably from 1 to 20 parts by mass.

Next described is the case where the energy ray-curable resin composition contains 2) a polymer not having energy ray-curability and an energy ray-curable monomer and/or oligomer. Here, in the present specification, "polymer" means both a homopolymer and a copolymer.

The polymer not having energy ray-curability includes an acrylic resin, a polysulfone resin, a polyarylate resin, a polycarbonate resin, a polyester resin, a polyurethane resin, a polyolefin resin, a polyimide resin, etc. Of those, as the polymer not having energy ray-curability, preferred are an acrylic resin, a polysulfone resin, a polyarylate resin, a polycarbonate resin and a polyimide resin. One alone or two or more different types of such polymers not having energy ray-curability may be used here either singly or as combined.

The acrylic resin is preferably a (meth)acrylate copolymer. The (meth)acrylate copolymer comprises a constitutive unit derived from a functional group-containing monomer and a constitutive unit derived from a (meth)acrylate monomer or a derivative thereof. As the constitutive unit derived from a functional group-containing monomer and the constitutive unit derived from a (meth)acrylate monomer or a derivative thereof, herein mentioned are those exemplified for the acrylic copolymer (m1) described above.

The energy ray-curable monomer and/or oligomer include, for example, pentaerythritol tri(meth)acrylate, pentaerythritol tetra(meth)acrylate, trimethylolpropane tri(meth)acrylate, 1,4-butanediol di(meth)acrylate, 1,6-hexanediol di(meth)acrylate, polyethylene glycol di(meth)acrylate, polyurethane oligo(meth)acrylate, polyester oligo(meth)acrylate, tricyclodecanedimethanol diacrylate, etc. One alone or two or more different types of such energy ray-curable monomers and/or oligomers may be used here either singly or as combined.

The blend ratio of the polymer not having energy ray-curability and the energy ray-curable monomer and/or oligomer is preferably such that the amount of the energy ray-curable monomer and/or oligomer is from 5 to 200 parts by mass relative to 100 parts by mass of the polymer not having energy ray-curability, more preferably from 10 to 150 parts by mass, even more preferably from 25 to 100 parts by mass. Also in this case, the photopolymerization initiator, the crosslinking agent and the other additives mentioned above may be incorporated in the composition.

Next described is the case where the energy ray-curable resin composition contains 3) an energy ray-curable monomer and/or oligomer as the main ingredient thereof.

As the energy ray-curable monomer and/or oligomer, herein mentioned are those exemplified as the energy ray-curable monomer and/or oligomer described above. One alone or two or more different types of such energy ray-curable monomers and/or oligomers may be used here either singly or as combined. Also in this case, the photopolymerization initiator and the other additives mentioned above may be incorporated in the composition.

The thickness of the resin substrate 4 is determined in consideration of the depth of the recess pattern to be formed, or the like, and is preferably from 1 to 100 μm, more preferably from 5 to 50 μm. The thickness falling within the range is preferred as capable of securing the mechanical strength of the substrate and capable of fully lowering the thermal conductivity thereof.

Preferably, the resin substrate 4 has a large number of independent recesses 6. Having a large number of independent recesses 6 is preferred, since the thermal conductivity of the substrate can be fully lowered.

The shape of the recesses 6 is not specifically defined, including, for example, a pillar shape, such as a columnar shape, a prismatic shape, etc.; an inverted needle-pointed shape such as an inverted conical shape, an inverted pyramidal shape, etc.; an inverted truncated needle-pointed shape such as an inverted truncated conical shape, an inverted truncated pyramidal shape, etc.; a grooved shape, etc.; and the shape may also be combination of these shapes. In case where the recesses 6 are formed using the original plate 1 as described below, the shape of the recesses 6 of the resin substrate 4 could be a reversed pattern corresponding to the original plate 1, as described above.

For example, in case where the shape of the recesses 6 is columnar, the opening of the recesses 6 is circular; and in case where the shape of the recesses 6 is a groove-like one, the opening of the recesses 6 is linear.

The depth of the recesses 6 is preferably from 5 to 10000 nm, more preferably from 10 to 10000 nm, even more preferably from 50 to 300 nm. The depth of 5 nm or more is preferred from the viewpoint of maintaining independent recesses. The depth of 10000 nm or less is preferred since the Seebeck coefficient can be fully expressed from the viewpoint of the thickness dependence of the Seebeck coefficient of the thermoelectric conversion material to be produced through vapor deposition. In the present invention, the depth of the recesses 6 is the depth between the top of the resin substrate and the inner bottom of the recesses.

In case where the shape of the recesses 6 is a columnar or grooved one, the diameter or the groove width of the recesses 6 is preferably from 10 to 5000 nm, more preferably from 10 to 300 nm. The diameter or the groove width of the recesses 6 of 10 nm or more is preferred since, for example, after a film of a thermoelectric semiconductor material is formed through vapor deposition or the like, the recesses are not clogged by the thermoelectric semiconductor layer so that the independent recesses can be maintained as such. The diameter or the groove width of 5000 nm or less is preferred since the thermoelectric conversion material can secure the mechanical strength thereof and sufficient reduction in the thermal conductivity of the material can be expected.

The array spacing of the recesses 6 (distance between the centers of the neighboring recesses) is preferably from 15 to 5500 nm, more preferably from 100 to 3000 nm, even more preferably from 200 to 1500 nm. The distance of 15 nm or more is preferred as longer than the mean free path of electrons and therefore hardly causing electron scattering so that the electrical conductivity is maintained. The distance of 5500 nm or less is preferred as shorter than the mean free path of phonons and therefore readily causing phonon scattering so that the thermal conductivity can be reduced.

The occupancy ratio of the recesses 6 in the resin substrate 4 (areal ratio=sum total of the area of the openings of the recesses/total area of the surface of the resin substrate) is generally from 5 to 90%, preferably from 10 to 50%. The occupancy ratio of the recesses 6 falling within the above range is preferred since sufficient reduction in the thermal conductivity can be expected. Concretely, the occupancy ratio is from 0.05 to 0.9 mm$^2$ or so per mm$^2$ of the resin substrate 4, and is preferably from 0.1 to 0.5 mm$^2$ or so.

The angle between the line nearly parallel to the inner wall surface of the recess 6 and the normal line standing on the resin substrate is preferably within ±15°, more preferably within ±10°. The angle to the normal line falling within ±15° is preferred since, for example, when a film of a thermoelectric semiconductor material such as a p-type bismuth telluride or the like is formed, p-type bismuth telluride would hardly adhere to the inner wall surface of the recesses 6 and therefore the film can maintain electric insulation. The angle between the centerline running through the recess 6 in the thickness direction of the resin substrate 4 and the normal line standing from the resin substrate can be measured on a SEM cross section photograph, etc.

(Thermoelectric Semiconductor Layer)

FIG. 3 shows one example of a cross section after formation of a thermoelectric semiconductor layer of a thermoelectric semiconductor material on a resin substrate for use in the present invention, in which (a) indicates a case where the thermoelectric semiconductor layer exists on the top of the resin substrate and on the inner bottom of each recess, and (b) indicates a case where the thermoelectric semiconductor layer exists only on the top of the resin substrate.

As shown in FIG. 3, the thermoelectric semiconductor layers 9 and 10 used in the thermoelectric conversion material of the present invention are layers of a thermoelectric semiconductor material, and are formed on the resin substrate 4.

The method for forming the thermoelectric semiconductor material is not specifically defined. For example, on the resin substrate 4, a film of a thermoelectric semiconductor material may be formed to be the thermoelectric semiconductor layer, according to a flash vapor deposition method, a vacuum arc vapor deposition method, screen printing, coating or the like thereon, thereby providing the thermoelectric conversion material of the present invention.

For lowering the thermal conductivity of the thermoelectric conversion material, the thermoelectric semiconductor layer may exist both on the top 8 of the resin substrate 4 and on the inner bottom 7 of the recess 6 as in FIG. 3(a), or may exist only on the top 8 of the resin substrate 4 but not existing on the inner bottom 7 of the recess 6 as in FIG. 3(b), so far as the electric insulation between the thermoelectric semiconductor layer on the inner bottom 7 of the recess 6 and the thermoelectric semiconductor layer 10 on the top 8 of the resin substrate 4 can be maintained. Above all, from the viewpoint that the thermoelectric semiconductor layer is easy to be formed with maintaining the electric insulation between the inner bottom 7 and the top 8, it is desirable that the thermoelectric semiconductor layer exists both on the top 8 of the resin substrate 4 and the inner bottom 7 of the recess 6. The film thickness of the thermoelectric semiconductor layer 10 is preferably from 5 to 5000 nm, more preferably from 10 to 1000 nm, even more preferably from 50 to 250 nm. The film thickness of the thermoelectric semiconductor layer 10 falling within the above range is preferred since the inner bottom 7 and the top 8 do not form a continuous layer and can maintain electric insulation therebetween, the thermoelectric semiconductor layer can be formed, and the material cost can be reduced and the productivity is therefore increased.

The film thickness of the thermoelectric semiconductor layer 9 on the inner bottom 7 of the recess 6 is preferably from 5 to 200 nm, more preferably from 5 to 100 nm. The film thickness on the inner bottom 7 falling within the above range is preferred since the recess 6 is not filled up with the thermoelectric semiconductor layer and the shape of the recess 6 can be maintained as such.

The thermoelectric semiconductor material includes, for example, a bismuth-tellurium-based thermoelectric semiconductor material such as a p-type bismuth telluride, an n-type bismuth telluride, $Bi_2Te_3$, etc.; a telluride-based thermoelectric semiconductor material such as GeTe, PbTe, etc.; an antimony-telluride-based thermoelectric semiconductor material; a zinc-antimony-based thermoelectric semiconductor material such as ZnSb, $Zn_3Sb_2$, $Zn_4Sb_3$, etc.; a silicon-germanium-based thermoelectric semiconductor material such as SiGe, etc.; a bismuth-selenide-based thermoelectric semiconductor material such as $Bi_2Se_3$, etc., a silicide-based thermoelectric semiconductor material such as β-$FeSi_2$, $CrSi_2$, $MnSi_{1.73}$, $Mg_2Si$, etc.; an oxide-based thermoelectric semiconductor material; a Heusler material such as FeVAl, FeVAlSi, FeVTiAl, etc.

Of those, preferred are a bismuth-tellurium-based thermoelectric semiconductor material such as a p-type bismuth telluride, an n-type bismuth telluride, $Bi_2Te_3$, etc., and a bismuth selenide-based thermoelectric semiconductor material such as $Bi_2Se_3$, etc., from the viewpoint of the thermoelectric performance thereof.

The p-type bismuth telluride has a hole as the carrier and has a positive Seebeck coefficient, and is preferably $Bi_xTe_3Sb_{2-x}$ where X is preferably $0<X\leq0.6$, more preferably $0.4<X\leq0.6$. X of more than 0 and 0.6 or less is preferred since the Seebeck coefficient and the electrical conductivity of the material are large and the material can maintain the characteristics of p-type thermoelectric conversion material.

The n-type bismuth telluride has an electron as the carrier and has a negative Seebeck coefficient, and is preferably $Bi_2Te_{3-y}Se_y$ where Y is preferably $0<Y\leq3$, more preferably $0.1<Y\leq2.7$. Y of more than 0 and 3 or less is preferred since the Seebeck coefficient and the electrical conductivity of the material are large and the material can maintain the characteristics of n-type thermoelectric conversion material.

One alone of the thermoelectric semiconductor material may be used in the present invention, but preferably a pair of the materials are used. For example, plural pairs of them may be used as electrically connected in series to each other via an electrode or as thermally connected in parallel to each other via an insulating material such as ceramics or the like, and can be used as a thermoelectric conversion device for power generation or for cooling.

[Method for Producing Thermoelectric Conversion Material]

The method for producing the thermoelectric conversion material of the present invention is a method for producing a thermoelectric conversion material having a film of a thermoelectric semiconductor material formed on a resin substrate having recesses, which comprises a resin substrate formation step of transcribing a protruding structure from an original plate having the protruding structure onto a resin layer of a curable resin composition and curing the layer, and a film formation step of forming a thermoelectric semiconductor layer of a thermoelectric semiconductor material on the resin substrate.

More precisely, the resin substrate formation step preferably includes a resin layer formation step of forming a resin layer from a curable resin composition, a transcription step of pressurizing the resin layer and an original plate having the above-mentioned protruding structure and arranged to face the resin layer so as to transcribe the protruding structure from the original plate to the resin layer, and a recesses formation step of curing the resin layer and then peeling the layer from the original plate to form the recesses on the layer.

First described is the production method of the present invention.

(1) Resin Substrate Formation Step

FIG. 4 includes explanatory views showing in sequence one example of the resin substrate formation step according to the production method of the present invention, in which the upper side of (a) is a cross-sectional view of an original plate and the underside thereof is a cross-sectional view after formation of a resin layer of a curable resin composition on a support, (b) is a cross-sectional view showing a curing step after pressurization and transcription, and (c) is a cross-sectional view of a resin substrate obtained by demolding after curing the resin layer.

(1)-1 Resin Layer Formation Step

As shown in FIG. 4(a), the step of forming a resin layer is, for example, a step of applying a coating material comprising a curable resin composition onto the support 12 to form the resin layer 13 thereon.

The support 12 is not specifically defined so far as the resin layer 13 may be uniformly formed thereon not having any influence on the reduction in the electrical conductivity of the thermoelectric conversion material and on the increase in the thermal conductivity thereof. For the support 12, for example, there are mentioned film, glass, silicon substrate, etc. As described below, in case where the resin substrate formed by curing is self-sustaining, then the support may be finally peeled off. In the case where the support is peeled off, it is desirable that the support is a release sheet of a film such as PET (polyethylene terephthalate) or the like of which the surface is treated for lubrication with a known lubricant (for example, silicone resin). In this case, the resin layer 13 is formed on the lubricant-treated surface side of the release sheet of the support 12.

The method for formation of the resin layer is not specifically defined, including, for example, knife coating, bar coating, lip coating, spin coating, roll coating, dip coating, die coating, gravure coating, etc.

(1)-2 Transcription Step

The transcription step is a step of arranging the resin layer 13 formed in (1)-1 and the original plate 11 having a protruding structure so as to face each other, pressuring them, as in FIG. 4(a), and transcribing the structure of the original plate 11 onto the resin layer 13, as in FIG. 4(b), thereby forming the resin layer 15 having recesses.

Any known method is usable for the transcription method. For example, it is desirable that the resin layer 13 is arranged to face a nanoimprint mold of the original plate 11, and the two are kept adjacent to each other, and thereafter pressurized under suitably controlled pressure to thereby fully transcribe the protruding structure of the original plate onto the resin layer 13.

(1)-3 Recesses Formation Step

The recesses formation step is a step of curing the resin layer 15 having the recesses transcribed in (1)-2, as in FIG. 4(b), and releasing the layer from the original plate 11, as in FIG. 4(c), thereby forming the resin substrate 16 having the recesses.

Concretely, in case where the curable resin composition is an energy ray-curable resin composition, the method of curing the resin layer 15 comprises using an energy ray radiation apparatus in the transcription step, and radiating an energy ray 14 to the resin layer 15 from the side of the original plate 11 or from the side of the support 12 to thereby cure the resin layer 15.

Not specifically defined, the energy ray includes electron ray, $\gamma$ ray, UV ray, etc. For example, in case where a photopolymerization initiator is used in the energy ray-curable resin composition, it is desirable that the resin layer 15 is irradiated with UV light emitted from a high-pressure mercury lamp or the like to be given predetermined energy, so that the resin layer 15 is cured to provide the resin substrate 16. Not specifically defined, the energy ray source includes a high-pressure mercury lamp, a metal halide lamp, a carbon arc lamp, a xenon lamp, etc.

The resin substrate formation step gives the recesses-having resin substrate 16 in which the predetermined shape of the recesses including the depth, the diameter and the wide thereof is controlled with accuracy.

(2) Film Formation Step

The film formation step is a step of forming a film of a thermoelectric semiconductor material on the resin substrate 16 produced in the previous resin substrate formation step, thereby forming a thermoelectric semiconductor layer thereon. Here, the film formation step is not specifically defined, for which preferred is a flash vapor deposition method or a vacuum arc vapor deposition method.

(Film Formation according to Flash Vapor Deposition Method)

The flash vapor deposition method is a method for film formation in which a granular film-forming material is continuously and little by little supplied into a crucible or a boat-type heater previously heated, for example, at a temperature not lower than the boiling point of the material and the material is instantaneously evaporated to form a film thereof. In vapor deposition according to the process, the material is instantaneously evaporated, and therefore, in particular, in case where an alloy comprising two or more different types of elements each having a different vapor pressure is vaporized, the compositional ratio can be kept more constantly as compared with a vapor deposition method in which the evaporation source of the material to be evaporated is fixed on a heater and evaporated thereon by heating.

In addition, according to the method, the material does not scatter and an unevaporated residue does not remain so that the material can be efficiently utilized and the production cost can be reduced. Further, according to the flash vapor deposition method, the straight-running capability of the material during vapor deposition is high, and therefore the material is hardly deposited on the wall surface inside the recesses. This is another advantage of the method.

EXAMPLES

Next, the present invention is described in more detail by reference to the Examples, but it should be construed that the present invention is not limited to these Examples at all.

The thermoelectric performance of the thermoelectric conversion materials produced in Examples and Comparative Examples was evaluated according to the methods mentioned below, in which the thermal conductivity, the Seebeck coefficient and the electrical conductivity of each material were calculated.

(a) Thermal Conductivity

A 3ω method was used for measurement of thermal conductivity.

(b) Seebeck Coefficient

One end of the sample produced was heated, and the resulting temperature difference between both ends of the sample was measured using a chromel-alumel thermocouple, and from the electrode adjacent to the thermocouple installation position, the thermoelectromotive force was measured. Concretely, the distance between both ends of the sample of which the temperature difference and the electromotive force are to be measured was to be 25 mm, one end was kept at 20° C., and the other end was heated from 25° C. to 50° C. at intervals of 1° C., whereupon the thermoelectromotive force was measured and the Seebeck coefficient was calculated from the inclination. The thermocouple installation position and the electrode installation position are symmetric to each other relative to the centerline of the thin film, and the distance between the thermocouple and the electrode is 1 mm.

(c) Electrical Conductivity

Using a surface resistivity meter (Mitsubishi Chemical's trade name: Loresta GP MCP-T600) and according to a four-terminal method, the surface resistivity of each sample of the thermoelectric conversion materials produced in Examples and Comparative Examples was measured, and the electrical conductivity thereof was calculated.

Example 1

(1) Preparation of Energy Ray-Curable Resin Composition 62 parts by mass of butyl acrylate, 10 parts by mass of methyl methacrylate and 28 parts by mass of 2-hydroxyethyl acrylate were polymerized in ethyl acetate to give an ethyl acetate solution of an acrylic copolymer having a hydroxyl group as the functional group (solid concentration 40% by mass). Next, 100 parts by mass of ethyl acetate, 30 parts by mass of an unsaturated group-containing compound having an isocyanate group as the substituent, methacryloyloxyethyl isocyanate (80.5 equivalents relative to 100 equivalents of 2-hydroxyethyl acrylate of the acrylic copolymer), and as a catalyst, 0.12 parts by mass of dibutyltin dilaurate were added to 250 parts by mass of the resultant ethyl acetate solution of the acrylic copolymer, and polymerized in a nitrogen atmosphere at room temperature for 24 hours to give a (meth)acrylate copolymer having an energy ray-curable group in the side chain thereof. The weight-average molecular weight (Mw) of the resulting energy ray-curable resin was 600,000.

Further, 3.7 parts by mass of a photopolymerization initiator, 1-hydroxy-cyclohexyl-phenyl ketone (Ciba Specialty Chemicals' trade name: Irgacure 184) were dissolved in 100 parts by mass, solid content, of the (meth)acrylate copolymer to control the solid concentration of the solution to be 35% by mass, thereby preparing an energy ray-curable resin composition to be a coating liquid for resin layer formation.

On the other hand, a release sheet of a polyethylene terephthalate (PET) film (thickness: 38 μm) of which one surface had been processed for lubrication with a silicone resin (Lintec's trade name "SP-PET3811", surface roughness of lubrication-processed side: Ra=0.016 μm) was prepared as a support.

Next, the coating agent was applied onto the lubrication-processed surface of the release sheet with a knife coater, and dried at 90° C. for 1 minute to form a resin layer having a thickness of 10

(2) Formation of Resin Substrate

The resin layer was kept facing a recesses-having original plate, nanoimprint mold (NTT-AT's semicustom mold "NIM-100UD", dot shape, protruding columnar, diameter: 100 nm, distance between the centers of the neighboring projections: 1000 nm), the two were made close to each other, stuck together, and adhered to each other so that no bubble could exist between the mold and the resin, and irradiated with UV ray at 3.6 J from the side of the release sheet, using a mask aligner (Mikasa's Model MA-10). After the irradiation, the resin layer was peeled away from the nanoimprint mold to give a resin substrate with desired recesses formed on the support. The thickness of the resin substrate was 10 μm.

(3) Formation of Thermoelectric Semiconductor Layer

According to a flash vapor deposition method, a film of a thermoelectric conversion material, p-type bismuth telluride ($Bi_{0.4}Te_3Sb_{1.6}$) was formed on the resin substrate prepared in the above, thereby forming a thermoelectric semiconductor layer thereon to provide a thermoelectric conversion material of Example 1.

FIG. 5(a) is a SEM photograph showing a plane surface of the thermoelectric conversion material obtained in Example 1 of the present invention. As shown in FIG. 5(a), it is known that the resin substrate has a large number of independent columnar recesses. The film thickness of the film of the thermoelectric semiconductor layer ($Bi_{0.4}Te_3Sb_{1.6}$) formed on the surface of the resin substrate was 100 nm. The thermoelectric performance evaluation results are shown in Table 1.

Example 2

A thermoelectric conversion material was produced in the same manner as in Example 1, except that as the original plate, used was a nanoimprint mold (NTT-AT's semicustom mold "NIM-150UL", line shape: recessed lines, line width: 150 nm, distance between the centers of the lines: 1000 nm). FIG. 5(b) is a SEM photograph showing a plane surface of the thermoelectric conversion material obtained in Example 2 of the present invention. As shown in FIG. 5(b), it is known that the resin substrate has a large number of independent grooved recesses. The thickness of the resin substrate was 10 μm, and the film thickness of the film of the thermoelectric semiconductor layer ($Bi_{0.4}Te_3Sb_{1.6}$) formed on the surface of the resin substrate was 200 nm.

Example 3

A thermoelectric conversion material was produced in the same manner as in Example 1, except that, as the original plate, used was a nanoimprint mold (NTT-AT's "NIM-PH350", pattern mix shape: shape of recesses: columnar and line-like, width of recesses: diameter 650 nm and line width 350 nm, distance between the centers of the neighboring recesses: 1000 nm). FIGS. 6(a) and (b) are SEM photographs each showing a plane surface of the thermoelectric conversion material obtained in Example 3 of the present invention. As shown in FIGS. 6(a) and (b), it is known that the resin substrate has a large number of independent columnar recesses (FIG. 6(a)) and grooved recesses (FIG. 6(b)). The thickness of the resin substrate was 10 μm, and the film thickness of the thermoelectric semiconductor layer ($Bi_{0.4}Te_3Sb_{1.6}$) formed on the surface of the resin substrate was 100 nm.

Example 4

A thermoelectric conversion material was produced in the same manner as in Example 1, except that, as the energy ray-curable resin composition, used was the energy ray-curable resin composition mentioned below. The thickness of the resin substrate was 10 μm, and the film thickness of the thermoelectric semiconductor layer ($Bi_{0.4}Te_3Sb_{1.6}$) formed on the surface of the resin substrate was 100 nm.
(Preparation of Energy Ray-Curable Resin Composition)

95 parts by mass of butyl acrylate, 5 parts by mass of 2-hydroxyethyl acrylate and, as an initiator, 0.1 parts by mass of azobisisobutyronitrile were added to a mixed solvent of 175 parts by mass of ethyl acetate and 25 parts by mass of toluene, and stirred at 65° C. for 17 hours to give a solution of an acrylate copolymer having a weight-average molecular weight of 680,000 (molecular weight distribution=5.3, component having a molecular weight of 2,000,000 or more, 12.2% by mass). Ethyl acetate was added thereto to make the solution have a concentration of 30%.

Next, 15 parts by mass of an energy ray-curable oligomer having a carbonate structure (Nippon Synthetic Chemical Industry Co., Shiko UV-3210EA, weight-average molecular weight 10,000), 1.5 parts by mass of 1-hydroxycyclohexyl-phenyl ketone (Ciba Specialty Chemicals' Irgacure 184) and, as a crosslinking agent, 0.5 parts by mass of an XDI-type polyisocyanate compound (Soken Chemical's TD-75) were added to 100 parts by mass of the acrylate copolymer produced in the above, and ethyl acetate was added thereto to make the resultant solution have a concentration of 35%, thereby preparing an energy ray-curable resin composition to be a coating liquid for resin layer formation.

Example 5

A thermoelectric conversion material was produced in the same manner as in Example 1, except that, as the energy ray-curable resin composition, used was the energy ray-curable resin composition mentioned below. The thickness of the resin substrate was 10 wm, and the film thickness of the thermoelectric semiconductor layer ($Bi_{0.4}Te_3Sb_{1.6}$) formed on the surface of the resin substrate was 100 nm.
(Preparation of Energy Ray-Curable Resin Composition)

100 parts by mass of pellets of a polymer not having energy ray-curability, a polyether sulfone resin (BASF's ULTASON E 2010) were dissolved in dichloromethane to prepare a 15 mass % solution, and then 163 parts by mass of tricyclodecanedimethanol diacrylate (Shin-Nakamura Chemical Industry's ADCP) and 3.9 parts by mass of (2,4,6-trimethylbenzoyl)diphenyl phosphine (BASF's DAROCURE TPO) were added thereto, thereby preparing an energy ray-curable resin composition to be a coating liquid for resin layer formation.

Example 6

A thermoelectric conversion material was produced in the same manner as in Example 1, except that, as the energy ray-curable resin composition, used was the energy ray-curable resin composition mentioned below. The thickness of the resin substrate was 10 μm, and the film thickness of the film $Bi_{0.4}Te_3Sb_{1.6}$ formed on the surface of the resin substrate was 100 nm.
(Preparation of Energy Ray-Curable Resin Composition)

A solution containing a polymer not having energy ray-curability, polyimide (Nissan Chemical's SUNEVER 150) was diluted with butyl cellosolve to prepare a 15 mass % solution, and relative to 100 parts by mass of the polyimide, 163 parts by mass of tricyclodecanedimethanol diacrylate (Shin-Nakamura Chemical Industry's ADCP) and 3.9 parts by mass of (2,4,6-trimethylbenzoyl)diphenylphosphine oxide (BASF's DAROCURE TPO) were added thereto, thereby preparing an energy ray-curable resin composition to be a coating liquid for resin layer formation.

Comparative Example 1

A thermoelectric conversion material was produced by forming, on a resin substrate, a thermoelectric semiconductor layer of an alloy $Bi_{0.4}Te_3Sb_{1.6}$ according to a flash vapor deposition method in the same manner as in Example 1, except that the nanoimprint mold was not used in Example 1 and that a resin substrate not having recesses was formed by curing the resin layer and the resin substrate was used here. The thickness of the resin substrate was 10 μm, and the film thickness of the thermoelectric semiconductor layer ($Bi_{0.4}Te_3Sb_{1.6}$) formed on the surface of the resin substrate was 100 nm.

The thermoelectric performance evaluation results are shown in Table 1.

TABLE 1

| | | Nanostructure of Resin Substrate | | | | | Thermoelectric Performance Evaluation | | | | |
| --- | --- | --- | --- | --- | --- | --- | --- | --- | --- | --- | --- |
| | Type of Mold | Shape of Recesses | Depth of Recesses (nm) | Width of Recesses (nm) | Array Spacing of Recesses (nm) | Proportion of Recesses in Resin Substrate (%) | Thickness of Thermoelectric Semiconductor Layer (nm) | Electrical Conductivity (S/cm) | Seebeck Co-efficient (μV/K) | Thermal Conductivity (W/(mK)) | ZT (T: 300K) |
| Example 1 | 100 nm dot | columnar | 100 | 100 | 1000 | 33 | 100 | 160 | 150 | 0.26 | 0.41 |
| Example 2 | 150 nm line & space | grooved | 150 | 150 | 1000 | 35 | 200 | 150 | 180 | 0.58 | 0.25 |
| Example 3 | pattern mix | columnar and grooved | 650/350 (column/groove) | 650/350 (column/groove) | 1000 | 25 | 100 | 150 | 160 | 0.78 | 0.15 |
| Example 4 | 100 nm dot | columnar | 100 | 100 | 1000 | 33 | 100 | 150 | 150 | 0.26 | 0.39 |
| Example 5 | 100 nm dot | columnar | 100 | 100 | 1000 | 33 | 100 | 155 | 150 | 0.26 | 0.40 |
| Example 6 | 100 nm dot | columnar | 100 | 100 | 1000 | 33 | 100 | 158 | 150 | 0.26 | 0.41 |

TABLE 1-continued

| | Nanostructure of Resin Substrate | | | | | | Thermoelectric Performance Evaluation | | | | |
|---|---|---|---|---|---|---|---|---|---|---|---|
| | Type of Mold | Shape of Recesses | Depth of Recesses (nm) | Width of Recesses (nm) | Array Spacing of Recesses (nm) | Proportion of Recesses in Resin Substrate (%) | Thickness of Thermoelectric Semiconductor Layer (nm) | Electrical Conductivity (S/cm) | Seebeck Co-efficient (µV/K) | Thermal Conductivity (W/(mK)) | ZT (T: 300K) |
| Comparative Example 1 | no nano-structure | — | — | — | — | 0 | 100 | 150 | 100 | 2 | 0.02 |

The thermal conductivity of the thermoelectric conversion materials of Examples 1 to 6 greatly lowered as compared with that of the thermoelectric conversion material of Comparative Example 1 in which the resin substrate did not have recesses, and the non-dimensional figure of merit ZT of the former was high.

INDUSTRIAL APPLICABILITY

The thermoelectric conversion material of the present invention is formed into a thermoelectric conversion element that carries out energy interconversion between heat and electricity, and is set in a module and put into practical use. Concretely, the material is a high-efficiency thermoelectric conversion material and is therefore considered to be applicable to use for conversion of exhaust heat from industries and various combustion furnaces such as wastes incinerators, cement combustors and the like, as well as combustion gas exhaust heat from automobiles and exhaust heat from electronic instruments, into electricity.

REFERENCE SIGNS LIST 1, 11: Original Plate (nanoimprint mold)
2: Substrate
3: Protruding Structure (protrusions of original plate)
4, 16: Resin Substrate
5, 12: Support
6: Recess
7: Inner Bottom
8: Top of Resin Substrate
9: Thermoelectric Semiconductor Layer (on the inner bottom)
10: Thermoelectric Semiconductor Layer (on the top of substrate)
13: Resin Layer
14: Energy Ray
15: Resin Layer (after transcription)

The invention claimed is:

1. A method for producing a thermoelectric conversion material having a film of a thermoelectric semiconductor layer formed on a resin substrate having recesses, the method comprising:

transcribing a protruding structure from an original plate having the protruding structure onto a resin layer of a curable resin composition;
curing the resin layer to obtain the resin substrate having a plurality of independent recesses; and
forming a thermoelectric semiconductor layer of a thermoelectric semiconductor material on the resin substrate having the plurality of independent recesses,
wherein:
the thickness of the resin substrate is from 5 to 100 µm;
the recesses have a columnar shape;
the recesses have a depth less than the thickness of the resin substrate;
the depth of the recesses is from 5 to 10000 nm, the diameter of the recesses is from 10 to 5000 nm, and the distance between the centers of the neighboring recesses is from 1000 to 5500 nm;
the thermoelectric semiconductor layer exists on the top of the resin substrate; and
the thermoelectric semiconductor material on the top of the resin substrate is electrically insulated from the thermoelectric semiconductor material on the inner bottom of each recess, when the thermoelectric semiconductor material on the inner bottom of each recess is present.

2. The method for producing a thermoelectric conversion material according to claim 1, wherein the transcribing includes:
forming the resin layer from the curable resin composition;
pressurizing the resin layer and the original plate arranged to face each other so as to transcribe the protruding structure from the original plate to the resin layer; and
curing the resin layer and then peeling the resin layer from the original plate to form the recesses on the resin layer.

3. The method for producing a thermoelectric conversion material according to claim 1, wherein the forming of the thermoelectric semiconductor layer occurs by a flash vapor deposition method.

* * * * *